United States Patent
Wang et al.

(10) Patent No.: US 11,404,493 B2
(45) Date of Patent: Aug. 2, 2022

(54) OPTICAL SENSOR AND MANUFACTURING METHOD THEREOF, DISPLAY DEVICE AND DISPLAY APPARATUS

(71) Applicant: BOE TECHNOLOGY GROUP CO., LTD., Beijing (CN)

(72) Inventors: Guoying Wang, Beijing (CN); Zhen Song, Beijing (CN); Yicheng Lin, Beijing (CN); Ling Wang, Beijing (CN); Cuili Gai, Beijing (CN); Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 194 days.

(21) Appl. No.: 16/652,039

(22) PCT Filed: May 24, 2019

(86) PCT No.: PCT/CN2019/088299
§ 371 (c)(1),
(2) Date: Mar. 28, 2020

(87) PCT Pub. No.: WO2019/228258
PCT Pub. Date: Dec. 5, 2019

(65) Prior Publication Data
US 2020/0251537 A1 Aug. 6, 2020

(30) Foreign Application Priority Data
Jun. 1, 2018 (CN) .......................... 201810555446.9

(51) Int. Cl.
*G09G 5/00* (2006.01)
*H01L 27/32* (2006.01)
(Continued)

(52) U.S. Cl.
CPC ...... *H01L 27/3227* (2013.01); *H01L 27/1225* (2013.01); *H01L 27/322* (2013.01);
(Continued)

(58) Field of Classification Search
USPC .................... 345/156, 165, 166; 257/43, 292
See application file for complete search history.

(56) References Cited

U.S. PATENT DOCUMENTS

2008/0111779 A1  5/2008  Matsumoto
2008/0251729 A1  10/2008  Saito et al.
(Continued)

FOREIGN PATENT DOCUMENTS

CN   101183197 A   5/2008
CN   102738260 A   10/2012
(Continued)

OTHER PUBLICATIONS

First Office Action and English language translation, CN Application No. 201810555446.9, dated Mar. 13, 2020, 15 pp.
(Continued)

*Primary Examiner* — Thuy N Pardo
(74) *Attorney, Agent, or Firm* — Myers Bigel, P.A.

(57) ABSTRACT

The present disclosure provides an optical sensor, a manufacturing method thereof, a display device, and a display apparatus, and relates to the display technology. The optical sensor includes a thin film transistor and a PIN diode on a surface of a drain of the thin film transistor. A material of a P region of the PIN diode, a material of an I region of the PIN diode, and a material of an N region of the PIN diode are oxides. Since the PIN diode is made of oxides rather than amorphous silicon, hydrogen is not introduced. Therefore, the performance of the thin film transistor will not be affected, thereby achieving the improvement of the performance of the display device and the display effect.

14 Claims, 5 Drawing Sheets

(51) Int. Cl.
  *H01L 27/12*   (2006.01)
  *H01L 51/52*   (2006.01)
  *H01L 51/56*   (2006.01)

(52) U.S. Cl.
  CPC ...... *H01L 27/3244* (2013.01); *H01L 51/5228* (2013.01); *H01L 51/5234* (2013.01); *H01L 51/5284* (2013.01); *H01L 51/56* (2013.01); *H01L 2251/303* (2013.01)

(56) References Cited

U.S. PATENT DOCUMENTS

| | | | |
|---|---|---|---|
| 2012/0261656 A1 | 10/2012 | Shu et al. | |
| 2014/0061739 A1* | 3/2014 | Kurokawa | G06F 3/0412 257/292 |
| 2015/0028335 A1* | 1/2015 | Kurokawa | A61B 6/4208 257/43 |
| 2015/0279884 A1* | 10/2015 | Kusumoto | H01L 29/7869 257/43 |
| 2015/0279896 A1* | 10/2015 | Kurokawa | H04N 5/378 257/43 |
| 2015/0311245 A1* | 10/2015 | Yamazaki | H01L 27/1225 257/43 |
| 2016/0064444 A1* | 3/2016 | Inoue | H01L 27/14614 257/43 |
| 2016/0293655 A1* | 10/2016 | Yoneda | H01L 31/022408 |
| 2016/0322416 A1* | 11/2016 | Nara | H01L 29/7869 |
| 2016/0358961 A1* | 12/2016 | Yamazaki | H01L 27/14632 |
| 2017/0047449 A1 | 2/2017 | Takechi | |
| 2017/0170218 A1* | 6/2017 | Park | H01L 27/14634 |
| 2017/0288064 A1* | 10/2017 | Ito | H01L 29/42384 |
| 2018/0013010 A1* | 1/2018 | Kurokawa | H01L 27/14632 |
| 2018/0031876 A1* | 2/2018 | Liu | G09G 3/006 |
| 2018/0248043 A1* | 8/2018 | Asami | H01L 29/42376 |
| 2020/0251537 A1 | 8/2020 | Wang et al. | |
| 2020/0287075 A1* | 9/2020 | Huang | H01L 22/14 |

FOREIGN PATENT DOCUMENTS

| | | |
|---|---|---|
| CN | 102856441 A | 1/2013 |
| CN | 104282678 A | 1/2015 |
| CN | 105244383 A | 1/2016 |
| CN | 105552086 A | 5/2016 |
| CN | 106449861 A | 2/2017 |
| CN | 107017268 A | 8/2017 |
| CN | 108766989 A | 11/2018 |

OTHER PUBLICATIONS

Second Office Action and English language translation, ON Application No. 201810555446.9, dated Aug. 20, 2020, 12 pp.

* cited by examiner

OPTICAL SENSOR AND MANUFACTURING METHOD THEREOF, DISPLAY DEVICE AND DISPLAY APPARATUS

RELATED APPLICATIONS

The present application is a 35 U.S.C. 371 national stage application of PCT International Application No. PCT/CN2019/088299, filed on May 24, 2019, which claims the benefit of Chinese Patent Application No. 201810555446.9, filed on Jun. 1, 2018, the entire disclosures of which are incorporated herein by reference.

TECHNICAL FIELD

The present disclosure relates to the field of display technology, and in particular, to an optical sensor and a manufacturing method thereof, a display device, and a display apparatus.

BACKGROUND

Typically, electrical compensation is used in a brightness compensation scheme for an OLED (organic light-emitting diode) display device. The electrical compensation can only compensate the display Mura (the phenomenon of uneven brightness on the display causing various traces) caused by changes in the threshold voltage and mobility of the thin film transistor (TFT), but it cannot compensate the brightness change caused by the aging of OLED. Although the panel can be optically compensated as a whole when the panel leaves the factory, it cannot solve the Mura caused by the attenuation of the electroluminescence efficiency, that is, the real-time optical compensation cannot be achieved.

SUMMARY

The present disclosure provides an optical sensor, a manufacturing method thereof, a display device, and a display apparatus to improve the performance of the display device and the display effect.

In a first aspect, an embodiment of the present disclosure provides an optical sensor. The optical sensor includes: a thin film transistor and a PIN diode on a surface of a drain of the thin film transistor. A material of a P region of the PIN diode, a material of an I region of the PIN diode, and a material of an N region of the PIN diode are oxides.

In some embodiments, the material of the P region of the PIN diode is a P-type oxide; the material of the I region of the PIN diode is IGZO; and the material of the N region of the PIN diode is IGZO. An oxygen content of IGZO of the N region is lower than an oxygen content of IGZO of the I region.

In some embodiments, the P-type oxide includes at least one of $Cu_2O$ and $SnO$.

In a second aspect, an embodiment of the present disclosure provides a method for manufacturing an optical sensor, including: manufacturing a thin film transistor comprising a gate, a source, and a drain; and forming a P region, an I region, and an N region of a PIN diode on a surface of the drain by using oxides.

In some embodiments, the step of forming the P region, the I region, and the N region of the PIN diode on the surface of the drain by using oxides includes: depositing an IGZO layer of the N region, an IGZO layer of the I region, and a P-type oxide layer of the P region on the surface of the drain sequentially; an oxygen content of the IGZO layer of the N region being lower than an oxygen content of the IGZO layer of the I region; and patterning the IGZO layer of the N region, the IGZO layer of the I region, and the P-type oxide layer of the P region to form the PIN diode.

In some embodiments, the P-type oxide includes at least one of $Cu_2O$ and $SnO$.

In some embodiments, before the step of patterning the IGZO layer of the N region, the IGZO layer of the I region, and the P-type oxide layer of the P region to form the PIN diode, the method further includes: depositing a first transparent conductive layer on the P-type oxide layer of the P region.

In a third aspect, an embodiment of the present disclosure provides a display device including the optical sensor as described in the first aspect.

In some embodiments, the display device further includes: a black matrix on the thin film transistor; a color film covering the PIN diode and partially covering the black matrix; an organic cover layer on the black matrix and the color film; a spacer layer on the organic cover layer; an auxiliary electrode on the spacer layer; and a transparent cathode covering the organic cover layer, the spacer layer, and the auxiliary electrode.

In a fourth aspect, an embodiment of the present disclosure also provides a display apparatus including the optical sensor as described in the first aspect.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

Figure 1:
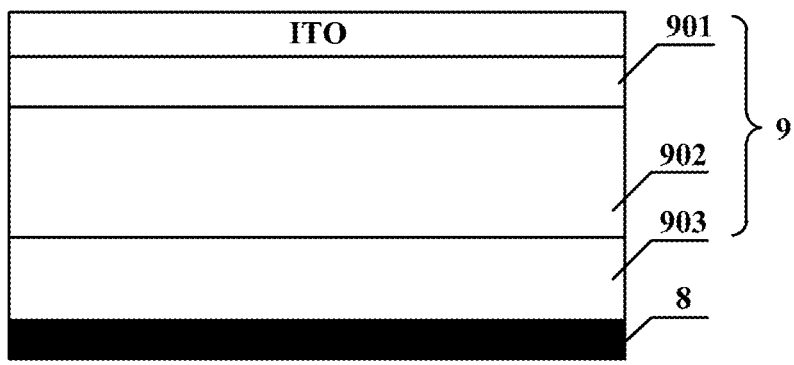
FIG. 1 is a schematic structural diagram of a PIN diode according to an embodiment of the present disclosure.

In the following, the technical solutions in embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

The inventors realized that for the brightness compensation solution of OLED display devices, it is necessary to introduce built-in compensation of optical sensors, that is, to arrange a photodiode (such as a PIN diode) near the OLED display device for real-time monitoring of brightness changes of the electroluminescent device. Real-time optical compensation for the panel can be realized through peripheral IC (integrated circuit) calculations.

A photosensor (such as a PIN diode) can be manufactured during the preparation of a thin film transistor. Generally, amorphous silicon is used to form the P region, I region, and N region of a PIN diode. However, a large amount of hydrogen will be introduced during the preparation of the PIN diode. Hydrogen may easily diffuse into the thin film transistor below the PIN diode, which seriously affects the characteristics of the thin film transistor. In addition, after the PIN diode is manufactured, the wet-etching process in the subsequent preparation of the thin film transistor will damage the side wall of the PIN diode and increase the leakage current. Moreover, a PECVD (plasma enhanced chemical vapor deposition) equipment is typically used to manufacture PIN diodes, which has a complicated process and low production efficiency. These problems hinder the application of optical compensation.

Referring to FIG. 1 and FIGS. 5-8, an embodiment of the present disclosure provides an optical sensor. The optical sensor includes: a thin film transistor and a PIN diode 9 on a surface of a drain 8 of the thin film transistor. A material of a P region 901 of the PIN diode 9, a material of an I region 902 of the PIN diode 9, and a material of an N region 903 of the PIN diode 9 are oxides.

Since the PIN diode is made of oxides rather than amorphous silicon, hydrogen is not introduced. Therefore, the performance of the thin film transistor will not be affected, thereby achieving the improvement of the performance of the display device and the display effect. By applying the optical sensor including the photosensor (i.e., the PIN diode) and a thin film transistor for optical compensation control to a display device, real-time optical compensation can be realized, and the display Mura caused by the brightness change of the electroluminescent device can be effectively solved, thereby improving the display effect.

Those skilled in the art can understand that the drain and source of the thin film transistor are interchangeable. That is, in the context of the present disclosure, the PIN diode may be located on the surface of the drain of the thin film transistor, and the PIN diode may also be located on a surface of the source of the thin film transistor.

In some embodiments, the material of the P region of the PIN diode is a P-type oxide, such as $Cu_2O$ and/or SnO. The material of the I region of the PIN diode is IGZO (indium gallium zinc oxide). The material of the N region of the PIN diode is IGZO, and an oxygen content of IGZO of the N region is lower than an oxygen content of IGZO of the I region. That is, the material of the I region of the PIN diode is high-oxygen IGZO, and the material of the N region of the PIN diode is low-oxygen IGZO.

Of course, those skilled in the art can also use other oxides to manufacture the PIN diode, as long as the characteristics of the oxides meet the requirements for the respective regions of the PIN diode.

Figure 2:
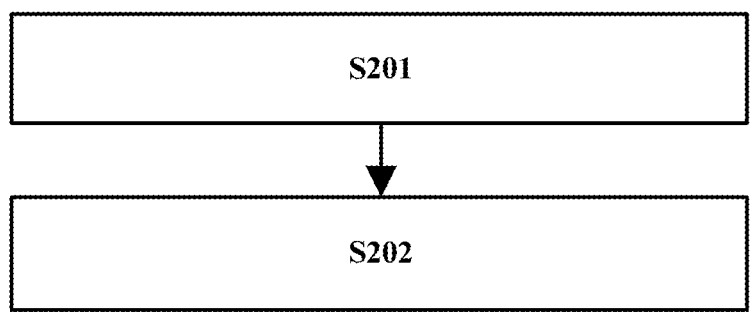
FIG. 2 is a flowchart of a method for manufacturing an optical sensor according to an embodiment of the present disclosure.

Accordingly, an embodiment of the present disclosure also provides a method for manufacturing an optical sensor. As shown in FIG. 2, the manufacturing method includes the following steps.

Step S201, manufacturing a thin film transistor comprising a gate, a source, and a drain.

Step S202, forming a P region, an I region, and an N region of a PIN diode on a surface of the drain by using oxides.

In step S202, forming the P region, the I region, and the N region of the PIN diode on the surface of the drain by using oxides may specifically include: depositing an IGZO layer of the N region, an IGZO layer of the I region, and a P-type oxide layer of the P region on the surface of the drain sequentially; an oxygen content of the IGZO layer of the N region being lower than an oxygen content of the IGZO layer of the I region; and patterning the IGZO layer of the N region, the IGZO layer of the I region, and the P-type oxide layer of the P region to form the PIN diode.

In some embodiments, the P-type oxide includes at least one of $Cu_2O$ and SnO. That is, the P-type oxide may be $Cu_2O$ and/or SnO.

Optionally, after the step of depositing the IGZO layer of the N region, the IGZO layer of the I region, and the P-type oxide layer of the P region on the surface of the drain sequentially, and before the step of patterning the IGZO layer of the N region, the IGZO layer of the I region, and the P-type oxide layer of the P region to form the PIN diode, the method further includes: depositing a first transparent conductive layer on the P-type oxide layer of the P region. The material of the first transparent conductive layer may be ITO (indium tin oxide). In this way, only one patterning process is needed to complete patterning the first transparent conductive layer and forming the PIN diode simultaneously, which reduces the number of process steps and reduces the complexity of the process.

Figure 3:
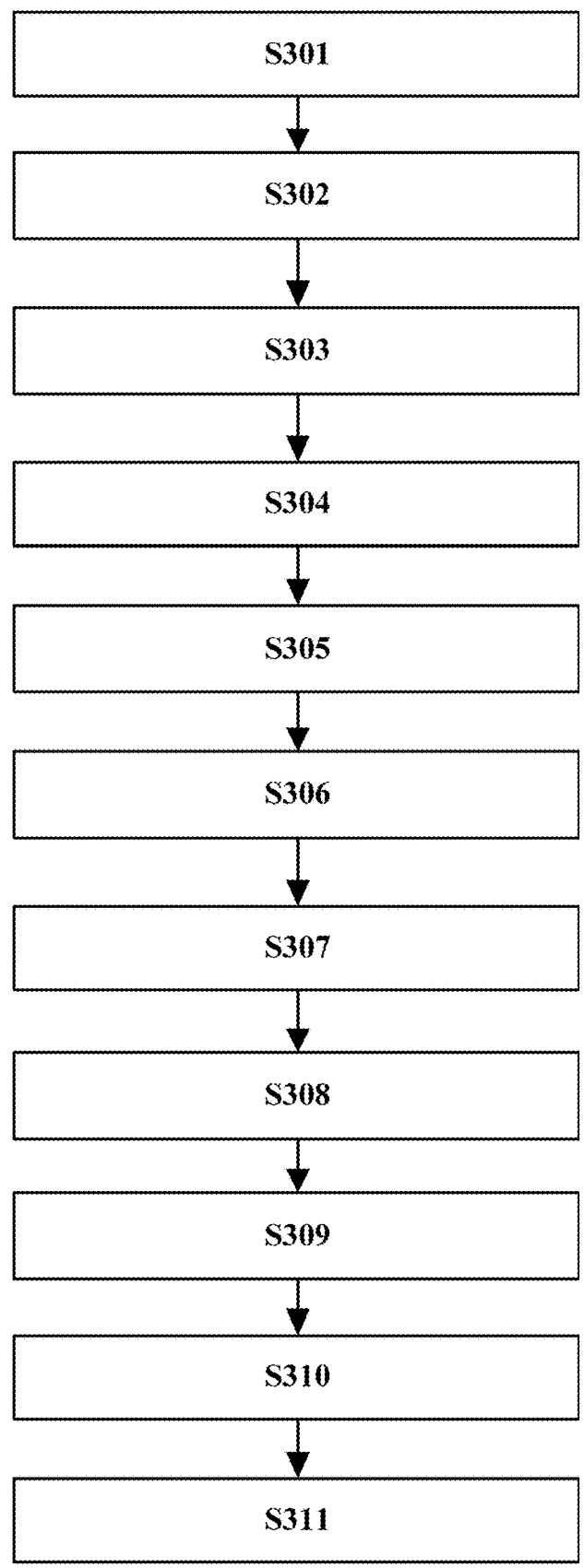
FIG. 3 is a flowchart of a method for manufacturing a display device according to an embodiment of the present disclosure.

A method for manufacturing a display device including an optical sensor is described in detail below. As shown in FIG. 3, the method may include the following steps.

Figure 4:
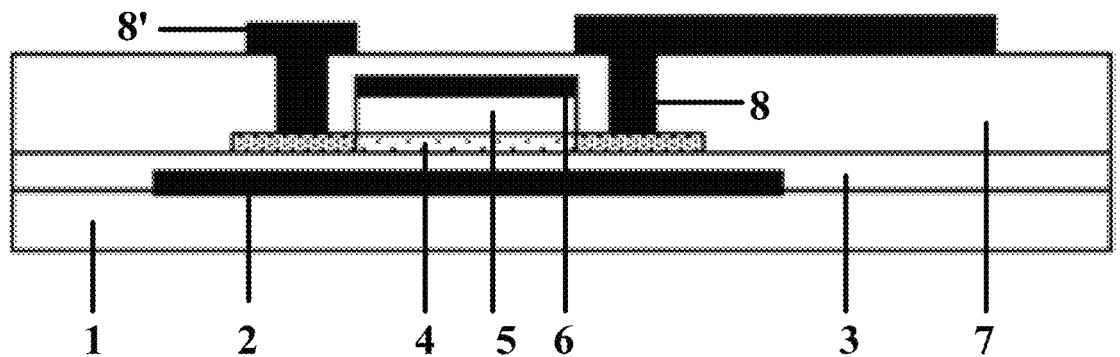
FIG. 4 to FIG. 8 are schematic structural diagrams of a display device according to an embodiment of the present disclosure.

Step S301, as shown in FIG. 4, a metal material is deposited on the glass cover 1, and then a photoresist is applied to etch the metal material to form a shielding metal pattern 2. The metal material may be a metal material such as Mo, Al, Ti, Au, Cu, Hf, and Ta, or an alloy material such as AlNd and MoNb.

Step S302, as shown in FIG. 4, a buffer layer 3 and an active layer are sequentially deposited, and then the active layer 4 is wet-etched to form an active island. The material of the buffer layer 3 may be an insulating material such as silicon oxide, silicon nitride, and silicon oxynitride. The material of the active layer 4 may be a metal oxide material, such as IGZO.

Step S303, as shown in FIG. 4, a gate insulating (GI) layer 5 and a gate layer 6 are sequentially deposited, and a photoresist is applied. By using a mask, the gate layer 6 is wet-etched first, and then the gate insulating layer 5 is dry-etched. The material of the gate insulating layer 5 may be an insulating material such as silicon oxide, silicon nitride, and silicon oxynitride. The material of the gate layer 6 may be a metal material such as Mo, Al, Ti, Au, Cu, Hf, and Ta. A Cu process can also be used to manufacture the gate layer 6, and the material of the gate layer 6 may be MoNd/Cu/MoNd.

Step S304, as shown in FIG. 4, an interlayer dielectric (ILD) layer 7 is deposited, the interlayer dielectric layer 7 is photoetched to form an ILD hole. A source-drain metal layer is deposited and the source-drain metal layer is etched, thereby forming a source 8' and a drain 8.

Figure 5:
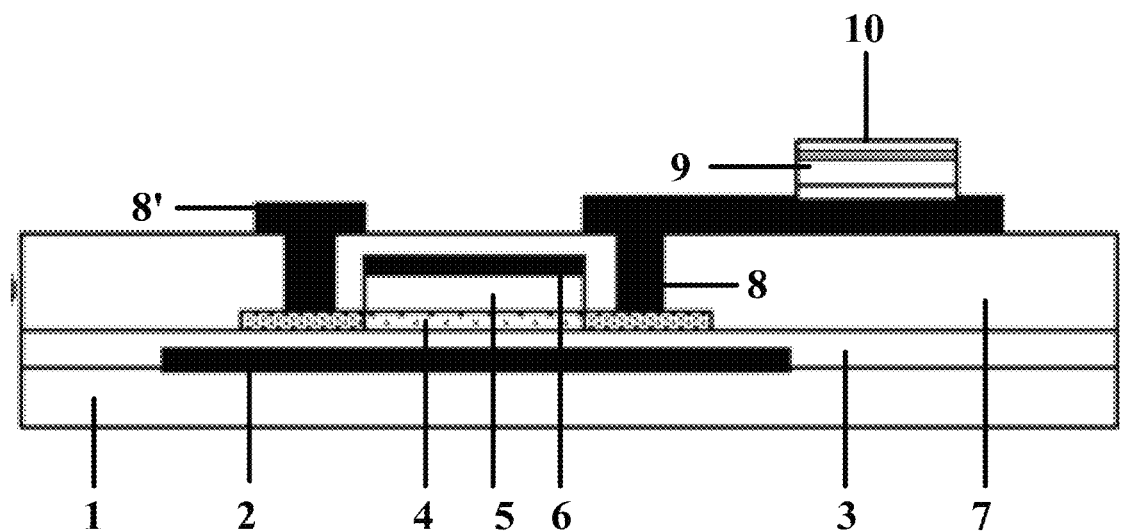

Step S305, as shown in FIG. 5, a low-oxygen IGZO of the N region, a high-oxygen IGZO of the I region, a P-type oxide $Cu_2O$, SnO, etc. of the P region are sequentially deposited, and then a first transparent conductive layer 10 is deposited. The first transparent conductive layer 10 may be deposited by a sputtering method. Only one mask is used to form the PIN diode 9 and the pattern of the first transparent conductive layer 10 on the PIN diode 9 by a wet-etching process. The first transparent conductive layer 10 is an electrode of the PIN diode 9.

Figure 6:
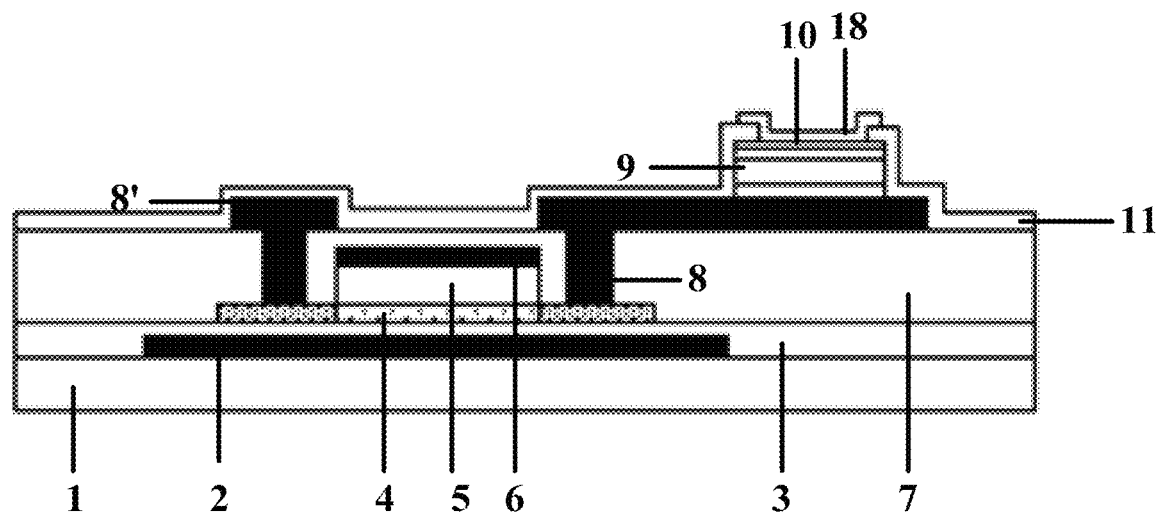

Step S306, as shown in FIG. 6, a PVX layer 11 is deposited, and a via is formed. A second transparent conductive layer 18 is deposited and patterned, and the second transparent conductive layer 18 serves as a lead for the first transparent conductive layer 10.

So far, the preparation of the optical sensor is completed. In order to manufacture a glass cover for top emission, for example, the following steps 307-311 can be arranged.

Figure 7:
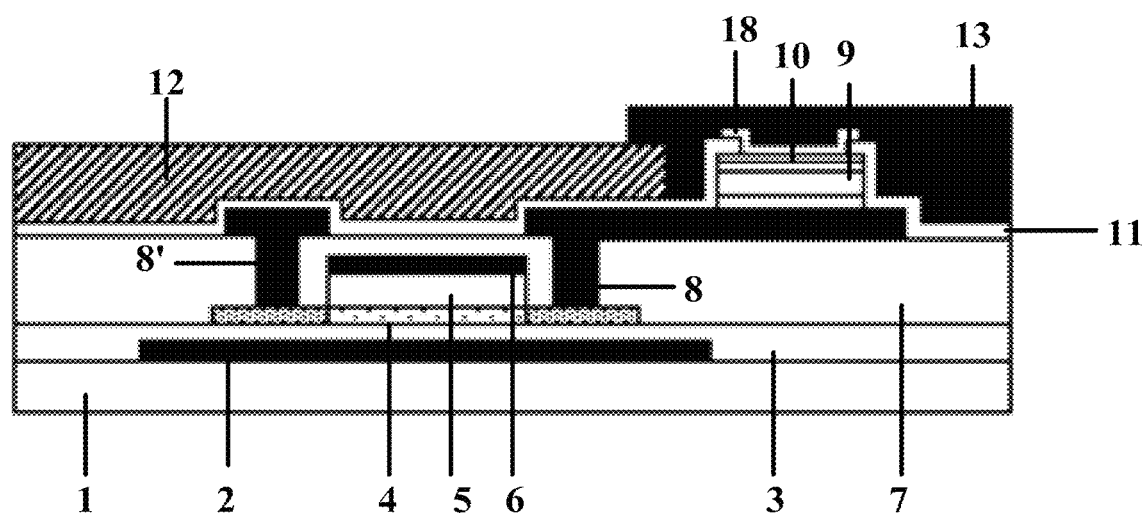

Step S307, as shown in FIG. 7, a black matrix (BM) 12 is deposited and patterned so that the black matrix 12 covers the thin film transistor of the active matrix.

Step S308, as shown in FIG. 7, a color film (CF) is deposited. In the preparation of the CF layer 13, R, G, and B color films are deposited sequentially. The color film covers a part of the black matrix 12.

Figure 8:
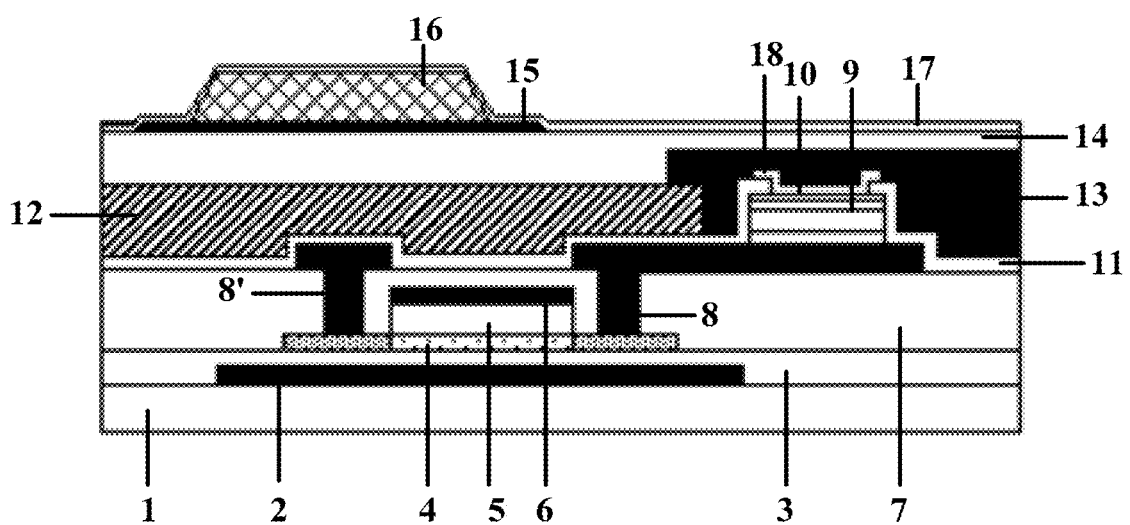

Step S309, as shown in FIG. 8, an organic coating (OC) layer 14 and an auxiliary electrode 15 are deposited and patterned. The material of the organic coating layer may include, but is not limited to, resin, silicon-glass bonding structure material (silicon on glass, SOG) and BCB (benzocyclobutene) and other planarization materials. The material of the auxiliary electrode 15 may be a metal material such as Mo, Al, Ti, Au, Cu, Hf, and Ta, or an alloy such as AlNd and MoNb, or a multilayer metal material such as MoNb/Cu/MoNb and AlNd/Mo/AlNd.

Step S31, as shown in FIG. 8, a PS (photo spacer) layer 16 is deposited and a spacer is formed.

Step S311, as shown in FIG. 8, a transparent conductive oxide (transparent conductive oxide, TCO) film is deposited as the transparent cathode 17. The transparent conductive oxide material may include, but is not limited to transparent conductive oxide such as AZO, IZO, AZTO, and a combination thereof. The transparent conductive oxide material may also include thin metal materials such as Mg/Ag, Ca/Ag, Sm/Ag, Al/Ag, Ba/Ag and other composite materials.

Through the above-mentioned steps, the cover portion of the thin film transistor is completed.

Through this embodiment, a control thin film transistor with a top-gate self-aligned structure is designed. This technical solution is also applicable to the thin film transistor with a structure such as an etch stop layer (ESL) structure, a back channel etched (BCE) structure and the like. The material of the active layer in the thin film transistor may be IGZO oxide semiconductor, and it can also be amorphous silicon (a-Si), etc.

It should be noted that although the operations of the methods provided by the present disclosure are described in a specific order in the drawings, this does not require or imply that these operations must be performed in that specific order, or that all these operations shown must be performed to achieve the desired results. Instead, the order of execution for the steps depicted in the flowchart can be changed. Additionally, or alternatively, certain steps may be omitted, multiple steps may be combined into one step for execution, and/or one step may be split into multiple steps for execution.

An embodiment of the present disclosure further provides a display device including the optical sensor provided by the embodiments of the present disclosure.

The display device may further include: a black matrix on the thin film transistor; a color film covering the PIN diode and partially covering the black matrix; an organic cover layer on the black matrix and the color film; a spacer layer on the organic cover layer; an auxiliary electrode on the spacer layer; and a transparent cathode covering the organic cover layer, the spacer layer, and the auxiliary electrode.

An embodiment of the present disclosure also provides a display apparatus, which includes the optical sensor provided by the embodiments of the present disclosure.

In some embodiments, the display apparatus is a top emission display apparatus or a bottom emission display apparatus.

The embodiments of the present disclosure provide an optical sensor, a manufacturing method thereof, a display device, and a display apparatus. The optical sensor includes: a thin film transistor and a PIN diode on a surface of a drain of the thin film transistor. A material of a P region of the PIN diode, a material of an I region of the PIN diode, and a material of an N region of the PIN diode are oxides. Since the PIN diode is made of oxides rather than amorphous silicon, hydrogen is not introduced. Therefore, the performance of the thin film transistor will not be affected, thereby achieving the improvement of the performance of the display device and the display effect.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. An optical sensor comprising:
   a thin film transistor; and
   a PIN diode on a surface of a drain of the thin film transistor, the PIN diode being in direct contact with the surface of the drain,
   wherein a material of a P region of the PIN diode, a material of an I region of the PIN diode, and a material of an N region of the PIN diode respectively comprise oxides.

2. The optical sensor according to claim 1,
   wherein the material of the P region of the PIN diode comprises a P-type oxide,
   wherein the material of the I region of the PIN diode comprises IGZO,
   wherein the material of the N region of the PIN diode comprises IGZO, and
   wherein an oxygen content of IGZO of the N region is lower than an oxygen content of IGZO of the I region.

3. The optical sensor according to claim 2, wherein the P-type oxide comprises at least one of $Cu_2O$ or SnO.

4. A display device comprising the optical sensor according to claim 1.

5. The display device according to claim 4, further comprising:
   a black matrix on the thin film transistor;
   a color film on the PIN diode and partially covering the black matrix;
   an organic cover layer on the black matrix and the color film;
   a spacer layer on the organic cover layer;
   an auxiliary electrode on the spacer layer; and
   a transparent cathode on the organic cover layer, the spacer layer, and the auxiliary electrode.

6. A display apparatus comprising the optical sensor according to claim 1.

7. The display device according to claim 4,
   wherein the material of the P region of the PIN diode comprises a P-type oxide,
   wherein the material of the I region of the PIN diode comprises IGZO, wherein the material of the N region of the PIN diode comprises IGZO, and wherein an oxygen content of IGZO of the N region is lower than an oxygen content of IGZO of the I region.

8. The display device according to claim 7, wherein the P-type oxide comprises at least one of $Cu_2O$ or SnO.

9. The display apparatus according to claim 6, wherein the material of the P region of the PIN diode comprises a P-type oxide, wherein the material of the I region of the PIN diode comprises IGZO, wherein the material of the N region of the PIN diode comprises IGZO, and wherein an oxygen content of IGZO of the N region is lower than an oxygen content of IGZO of the I region.

10. The display apparatus according to claim 9, wherein the P-type oxide comprises at least one of $Cu_2O$ or SnO.

11. A method for manufacturing an optical sensor, comprising:

manufacturing a thin film transistor comprising a gate, a source, and a drain; and forming a P region, an I region, and an N region of a PIN diode on a surface of the drain by using oxides, the PIN diode being in direct contact with the surface of the drain.

12. The method according to claim 11, wherein forming the P region, the I region, and the N region of the PIN diode on the surface of the drain by using oxides comprises:

depositing a first IGZO layer of the N region, a second IGZO layer of the I region, and a P-type oxide layer of the P region on the surface of the drain sequentially, wherein an oxygen content of the first IGZO layer of the N region is lower than an oxygen content of the second IGZO layer of the I region; and patterning the first IGZO layer of the N region, the second IGZO layer of the I region, and the P-type oxide layer of the P region to form the PIN diode.

13. The method according to claim 12, wherein the P-type oxide layer comprises at least one of $Cu_2O$ and SnO.

14. The method according to claim 12, wherein before patterning the first IGZO layer of the N region, the second IGZO layer of the I region, and the P-type oxide layer of the P region to form the PIN diode, the method further comprises:

depositing a first transparent conductive layer on the P-type oxide layer of the P region.

* * * * *